United States Patent
Lee

(10) Patent No.: US 10,141,400 B2
(45) Date of Patent: Nov. 27, 2018

(54) SEMICONDUCTOR DEVICES INCLUDING FIELD EFFECT TRANSISTORS WITH DUMMY GATES ON ISOLATION

(71) Applicant: Samsung Electronics Co., Ltd., Suwon-si, Gyeonggi-do (KR)

(72) Inventor: Jaekyu Lee, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/343,569

(22) Filed: Nov. 4, 2016

(65) Prior Publication Data

US 2017/0194425 A1 Jul. 6, 2017

(30) Foreign Application Priority Data

Jan. 5, 2016 (KR) .................. 10-2016-0001001

(51) Int. Cl.
| | |
|---|---|
| *H01L 29/06* | (2006.01) |
| *H01L 27/088* | (2006.01) |
| *H01L 27/092* | (2006.01) |
| *H01L 29/423* | (2006.01) |
| *H01L 21/28* | (2006.01) |
| *H01L 29/66* | (2006.01) |
| *H01L 21/8234* | (2006.01) |

(52) U.S. Cl.
CPC .... *H01L 29/0649* (2013.01); *H01L 21/28123* (2013.01); *H01L 27/088* (2013.01); *H01L 27/0883* (2013.01); *H01L 27/092* (2013.01); *H01L 29/42364* (2013.01); *H01L 21/82345* (2013.01); *H01L 29/66575* (2013.01)

(58) Field of Classification Search
CPC ............ H01L 29/0649; H01L 27/0883; H01L 27/092; H01L 29/42364
See application file for complete search history.

(56) References Cited

U.S. PATENT DOCUMENTS

| | | | |
|---|---|---|---|
| 6,100,143 A | 8/2000 | Brown et al. | |
| 7,566,934 B2 | 7/2009 | Hasegawa | |
| 7,569,887 B2 | 8/2009 | Otsuki | |
| 8,106,465 B2 | 1/2012 | Tanaka | |
| (Continued) | | | |

FOREIGN PATENT DOCUMENTS

| | | |
|---|---|---|
| KR | 2002-0096684 A | 12/2002 |
| KR | 10-2004-0013460 A | 2/2004 |
| (Continued) | | |

*Primary Examiner* — Peter Bradford
(74) *Attorney, Agent, or Firm* — Lee & Morse, P.C.

(57) ABSTRACT

A semiconductor device includes device isolation layer on a substrate to define an active region, a first gate electrode on the active region extending in a first direction parallel to a top surface of the substrate, a second gate electrode on the device isolation layer and spaced apart from the first gate electrode in the first direction, a gate spacer between the first gate electrode and the second gate electrode, and source/drain regions in the active region at opposite sides of the first gate electrode. The source/drain regions are spaced apart from each other in a second direction that is parallel to the top surface of the substrate and crossing the first direction, and, when viewed in a plan view, the first gate electrode is spaced apart from a boundary between the active region and the device isolation layer.

20 Claims, 21 Drawing Sheets

(56) References Cited

U.S. PATENT DOCUMENTS

| | | | |
|---|---|---|---|
| 2009/0194815 A1* | 8/2009 | Choi | H01L 21/76895 257/338 |
| 2010/0320529 A1* | 12/2010 | Dong | H01L 21/76224 257/327 |
| 2012/0001271 A1* | 1/2012 | Chae | H01L 29/4238 257/401 |
| 2012/0003805 A1* | 1/2012 | Bang | H01L 21/28123 438/296 |
| 2012/0280291 A1* | 11/2012 | Lee | H01L 21/28123 257/288 |

FOREIGN PATENT DOCUMENTS

| | | |
|---|---|---|
| KR | 10-2009-0034036 A | 4/2009 |
| KR | 10-2012-0045397 A | 5/2012 |
| KR | 10-2012-0124788 A | 11/2012 |

* cited by examiner

United States Patent 10,141,400 B2

SEMICONDUCTOR DEVICES INCLUDING FIELD EFFECT TRANSISTORS WITH DUMMY GATES ON ISOLATION

CROSS-REFERENCE TO RELATED APPLICATION

Korean Patent Application No. 10-2016-0001001, filed on Jan. 5, 2016, in the Korean Intellectual Property Office, and entitled: "Semiconductor Devices Including Field Effect Transistors," is incorporated by reference herein in its entirety.

BACKGROUND

1. Field

The present disclosure relates to a semiconductor device, and in particular, to a semiconductor device including field effect transistors.

2. Description of the Related Art

A semiconductor device may include integrated circuits (ICs) consisting of metal-oxide-semiconductor field-effect transistors (MOS-FETs). To meet an increasing demand for a semiconductor device with a small pattern size and a reduced design rule, the MOS-FETs are being scaled down. The scale-down of the MOS-FETs may lead to deterioration in operational properties of the semiconductor device. A variety of studies are being conducted to overcome technical limitations associated with the scale-down of the semiconductor device and to realize high performance semiconductor devices.

SUMMARY

Embodiments provide a semiconductor device with improved electric characteristics. Embodiments also provide a highly-reliable semiconductor device.

According to some embodiments, a semiconductor device may include a device isolation layer provided on a substrate to define an active region, a first gate electrode provided on the active region to extend in a first direction parallel to a top surface of the substrate, a second gate electrode provided on the device isolation layer and spaced apart from the first gate electrode in the first direction, a gate spacer between the first and second gate electrodes, and source/drain regions formed in the active region at both sides of the first gate electrode. The source/drain regions may be spaced apart from each other in a second direction that is parallel to the top surface of the substrate and crossing the first direction. When viewed in a plan view, the first gate electrode may be spaced apart from a boundary between the active region and the device isolation layer.

According to some embodiments, a semiconductor device may include a device isolation layer provided on a substrate to define an active region, a first gate electrode provided on the active region to extend in a first direction parallel to a top surface of the substrate, a second gate electrode provided on the device isolation layer and spaced apart from the first gate electrode in the first direction, and source/drain regions formed in the active region at both sides of the first gate electrode. The first and second gate electrodes may be spaced apart from each other, and a boundary between the active region and the device isolation layer may be positioned between the first and second gate electrodes.

According to some embodiments, a semiconductor device may include a device isolation layer provided on a substrate to define an active region, a first gate electrode provided on the active region to extend in a first direction parallel to a top surface of the substrate, a second gate electrode provided on the device isolation layer and spaced apart from the first gate electrode in the first direction, and source/drain regions formed in the active region at both sides of the first gate electrode. The second gate electrode may extend from a top surface of the device isolation layer onto a top surface of the active region to cross a boundary between the active region and the device isolation layer.

According to some embodiments, a semiconductor device may include a device isolation layer on a substrate to define an active region, a first gate electrode on the active region to extend in a first direction parallel to a top surface of the substrate, an edge of the first gate electrode being on the active region and spaced apart from a boundary between the active region and the device isolation layer, a second gate electrode on the device isolation layer and spaced apart from the first gate electrode in the first direction, a gate spacer between the first gate electrode and the second gate electrode, and source/drain regions in the active region at opposite sides of the first gate electrode.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully with reference to the accompanying drawings, in which example embodiments are shown.

Figure 1:
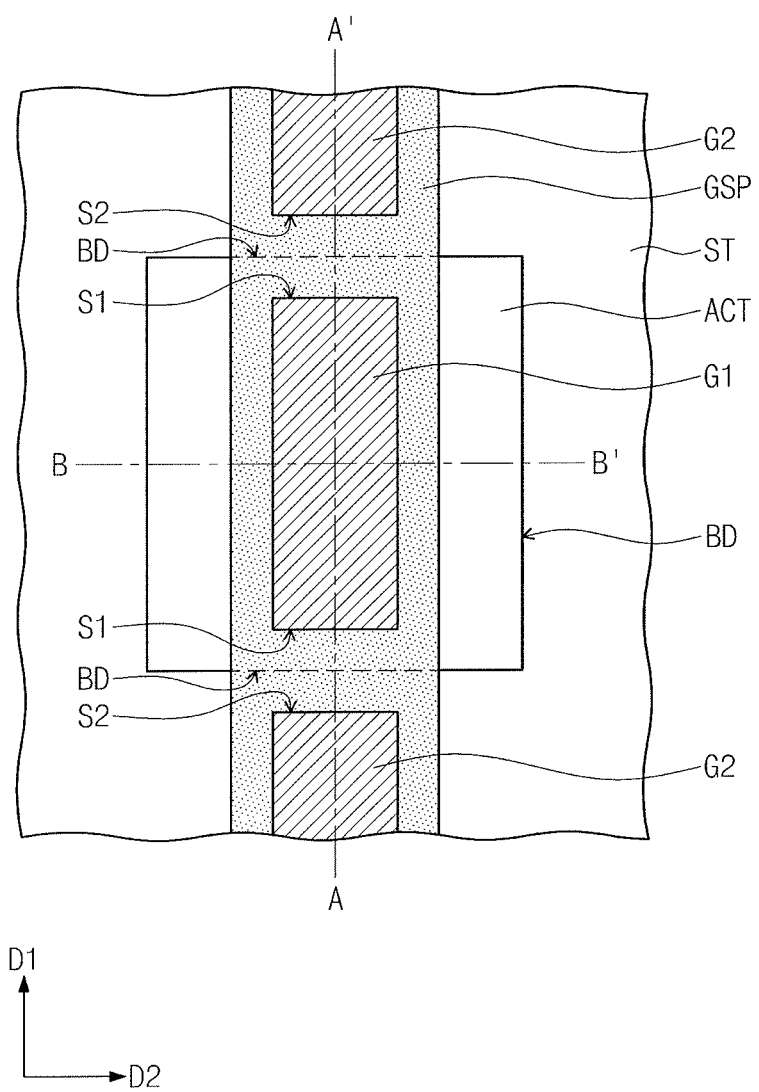
FIG. 1 illustrates a plan view of a semiconductor device according to some embodiments.
Figure 2:
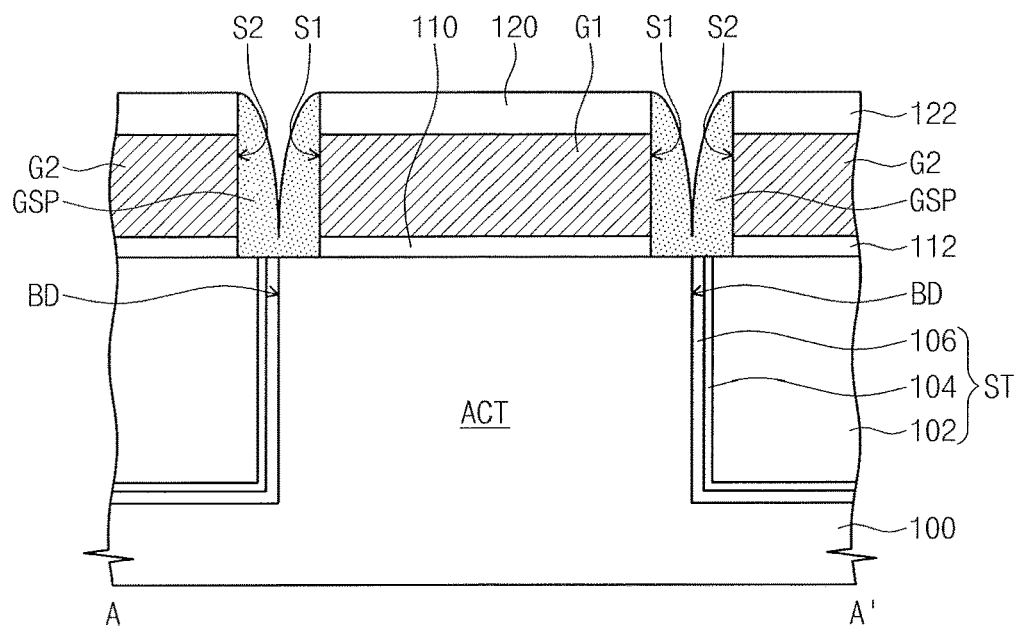
FIG. 2 illustrates a sectional view taken along line A-A' of FIG. 1.
Figure 3:
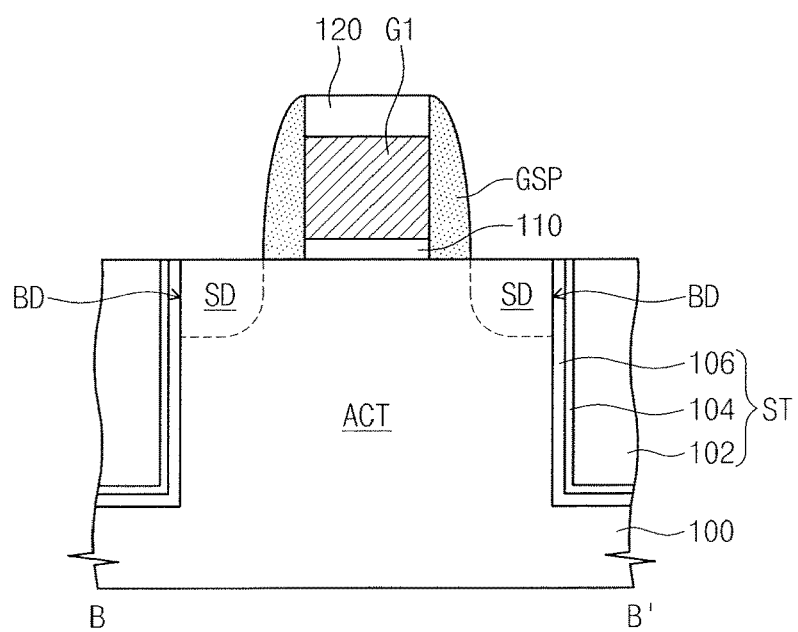
FIG. 3 illustrates a sectional view taken along line B-B' of FIG. 1.

FIG. 1 is a plan view illustrating a semiconductor device according to some embodiments. FIGS. 2 and 3 are sectional views taken along lines A-A' and B-B', respectively, of FIG. 1.

Referring to FIGS. 1 to 3, a device isolation layer ST may be provided on a substrate 100 to define an active region ACT. The substrate 100 may be a semiconductor substrate, e.g., a silicon wafer, a germanium wafer, or a silicon-germanium wafer. The active region ACT may have a structure protruding from the substrate 100 upwardly, e.g., in a direction perpendicular to a top surface of the substrate 100, and may have side surfaces that are surrounded or enclosed by the device isolation layer ST. In some embodiments, the active region ACT may have a top surface that is substantially coplanar with that of the device isolation layer ST.

The device isolation layer ST may include a first insulating layer 102 surrounding the side surfaces of the active region ACT, a second insulating layer 104 between the first insulating layer 102 and the side surfaces of the active region ACT, and a third insulating layer 106 between the second insulating layer 104 and the side surfaces of the active region ACT. The second insulating layer 104 may be provided to surround the side surfaces of the active region ACT, and may be interposed between the first insulating layer 102 and the substrate 100. The third insulating layer 106 may be provided to surround the side surfaces of the active region ACT, and may be interposed between the second insulating layer 104 and the substrate 100. The second insulating layer 104 may be formed of or include a material that is different from that of the first and third insulating layers 102 and 106. As an example, the first and third insulating layers 102 and 106 may be silicon oxide layers, and the second insulating layer 104 may be a silicon nitride layer.

A first gate electrode G1 may be provided on the active region ACT and may extend in a first direction D1 parallel to the top surface of the substrate 100. The first gate electrode G1 may be locally provided, e.g., only, on the top surface of the active region ACT. In other words, when viewed in a plan view, the first gate electrode G1 may not be overlapped with a boundary BD between the active region ACT and the device isolation layer ST. A second gate electrode G2 may be provided on the device isolation layer ST to be spaced apart from the first gate electrode G1 in the first direction D1. In some embodiments, the first and second gate electrodes G1 and G2 may be spaced apart from each other, and the boundary BD may be positioned between the first and second gate electrodes G1 and G2.

A gate spacer GSP may be provided between the first and second gate electrodes G1 and G2. The gate spacer GSP may be provided to cover a first side surface S1 of the first gate electrode G1 and may extend into a space between the first and second gate electrodes G1 and G2 to cover a second side surface S2 of the second gate electrode G2. The first side surface S1 of the first gate electrode G1 may face the second side surface S2 of the second gate electrode G2 in the first direction D1. The gate spacer GSP may be provided to fill at least a portion of the space between the first and second gate electrodes G1 and G2. In some embodiments, the gate spacer GSP may be provided on the boundary BD between the active region ACT and the device isolation layer ST. In other words, the gate spacer GSP may extend from the first side surface S1 of the first gate electrode G1 across the boundary BD in the first direction D1 to cover the second side surface S2 of the second gate electrode G2. The gate spacer GSP may cover the top surfaces of the active region ACT and the device isolation layer ST which are positioned between the first and second gate electrodes G1 and G2. The gate spacer GSP may be extended to cover other side surfaces of the first and second gate electrodes G1 and G2.

A first gate dielectric pattern 110 may be provided between the first gate electrode G1 and the active region ACT. The first gate dielectric pattern 110 may extend along a bottom surface of the first gate electrode G1. A first gate capping pattern 120 may be provided on a top surface of the first gate electrode G1. The first gate capping pattern 120 may extend along the top surface of the first gate electrode G1. The gate spacer GSP may be extended from the side surfaces of the first gate electrode G1 to cover side surfaces of the first gate dielectric pattern 110 and the first gate capping pattern 120. A second gate dielectric pattern 112 may be provided between the second gate electrode G2 and the device isolation layer ST and may extend along a bottom surface of the second gate electrode G2. A second gate capping pattern 122 may be provided on a top surface of the second gate electrode G2 and may extend along the top surface of the second gate electrode G2. The gate spacer GSP may be extended from the side surfaces of the second gate electrode G2 to cover side surfaces of the second gate dielectric pattern 112 and the second gate capping pattern 122.

The first and second gate electrodes G1 and G2 may be formed of or include a doped semiconductor material. As an example, the first and second gate electrodes G1 and G2 may be formed of or include a doped poly silicon layer. The first gate electrode G1 may have a conductivity type different from that of the substrate 100. The second gate electrode G2 may have the same conductivity type as that of the first gate electrode G1, but embodiments are not limited thereto. The first and second gate dielectric patterns 110 and 112 may be formed of or include at least one of oxide materials (e.g., silicon oxide), and the first and second gate capping patterns 120 and 122 may be formed of or include at least one of nitride materials (e.g., silicon nitride). The gate spacer GSP may be formed of or include at least one of nitride materials (e.g., silicon nitride).

Source/drain regions SD may be provided in the active region ACT at both sides of the first gate electrode G1. The source/drain regions SD may be spaced apart from each other in a second direction D2 that is parallel to the top surface of the substrate 100 and crossing the first direction D1. Each of the source/drain regions SD may be a doped region that is formed in the substrate 100. The source/drain regions SD may have a conductivity type that is different from that of the substrate 100 but is the same as that of the first gate electrode G1. As an example, a conductivity type of the substrate 100 may be an n-type, and a conductivity type of each of the first gate electrode G1 and the source/drain regions SD may be a p-type. In other words, the first gate electrode G1 and the source/drain regions SD may constitute a PMOS transistor. As another example, a conductivity type of the substrate 100 may be a p-type, and a conductivity type at each of the first gate electrode G1 and the source/drain regions SD may be an n-type. In other words, the first gate electrode G1 and the source/drain regions SD may constitute an NMOS transistor. In certain embodiments, the second gate electrode G2 may be a dummy gate electrode, to which no voltage is applied.

When a gate electrode crosses a boundary between the active region and the device isolation layer, a hot-electron-induced punchthrough (HEIP) phenomenon, i.e., a reduced effective channel length and an increased leakage current of a transistor including the gate electrode, may occur at the boundary region between the active region and the device isolation layer. As an example, if a channel were to be formed at the boundary region to cause a current flow through the boundary region, the second insulating layer 104 adjacent to the boundary region could have served as an electron-trapping layer, so electrons trapped in the second insulating layer 104 could have caused a lowered effective channel length and increased leakage current. The reduction in effective channel length of the transistor caused by the HEIP phenomenon may lead to deterioration of electric characteristics of a semiconductor device.

In contrast, according to embodiments, when viewed in a plan view, the gate spacer GSP may be provided on the boundary BD between the active region ACT and the device isolation layer ST, and the first gate electrode G1 may be provided to be spaced apart from the boundary BD. Accordingly, it is possible to suppress or prevent a channel from being formed at the boundary region between the active region ACT and the device isolation layer ST. In other words, it is possible to suppress or reduce a current flow passing through the boundary region between the active region ACT and the device isolation layer ST, and consequently, to suppress the HEIP phenomenon. As a result, it is possible to improve electric characteristics of the semiconductor device.

Figure 4:
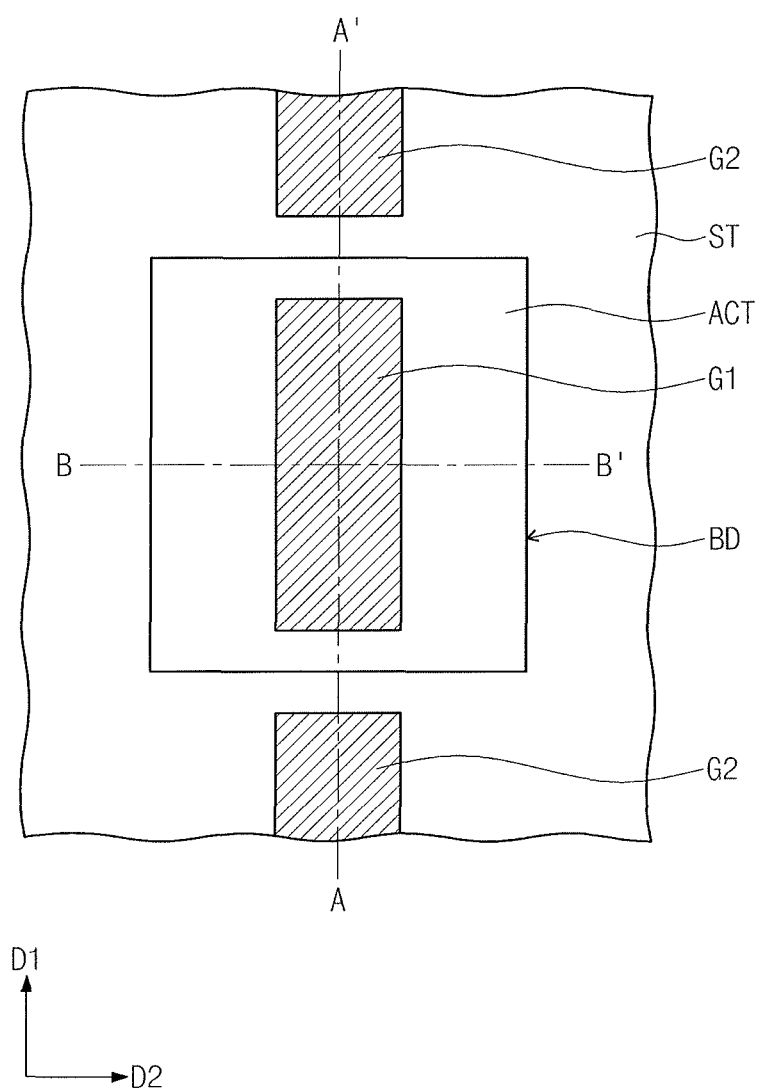
FIGS. 4 and 7 illustrate plan views of stages in a method of fabricating a semiconductor device, according to some embodiments.
Figure 5:
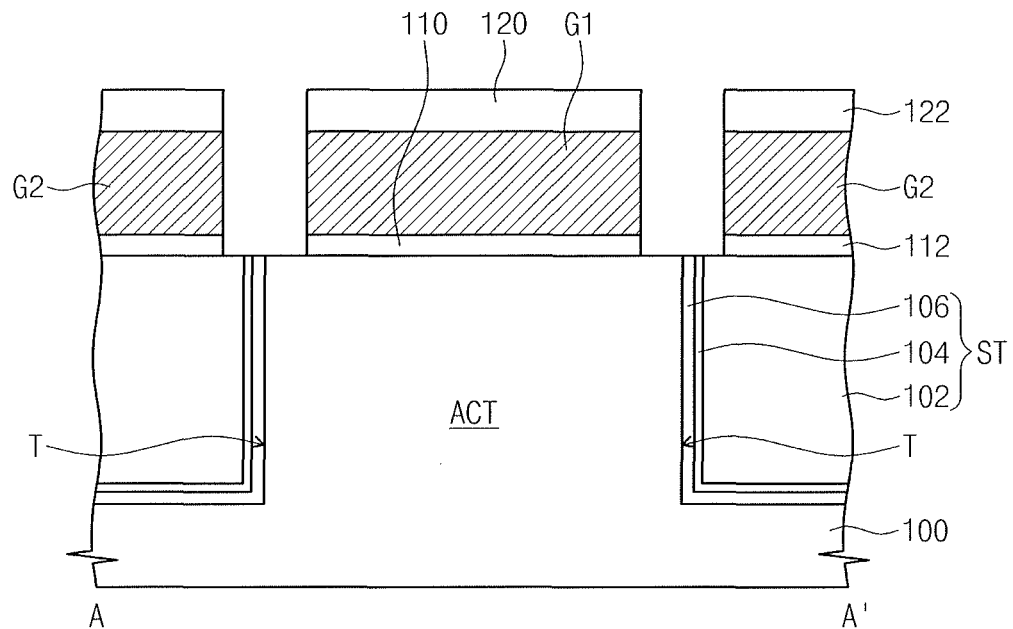
FIGS. 5 and 8 illustrate sectional views taken along line A-A' of FIGS. 4 and 7, respectively.
Figure 6:
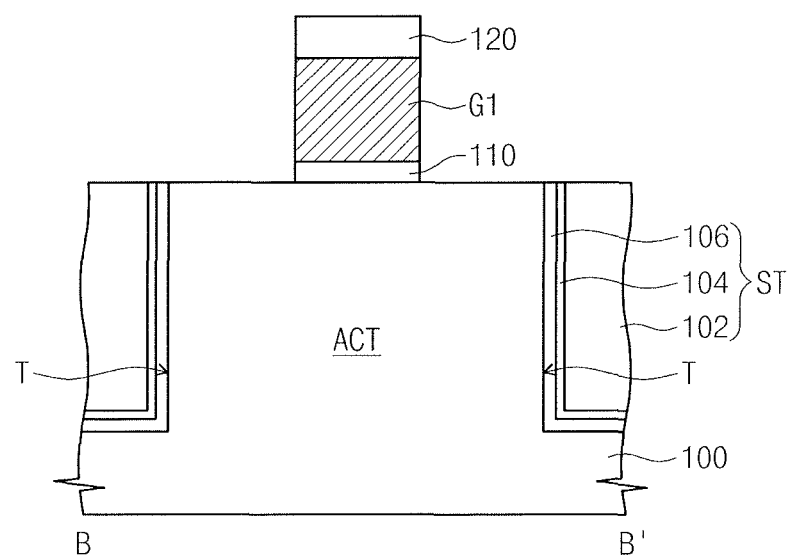
FIGS. 6 and 9 illustrate sectional views taken along line B-B' of FIGS. 4 and 7, respectively.
Figure 7:
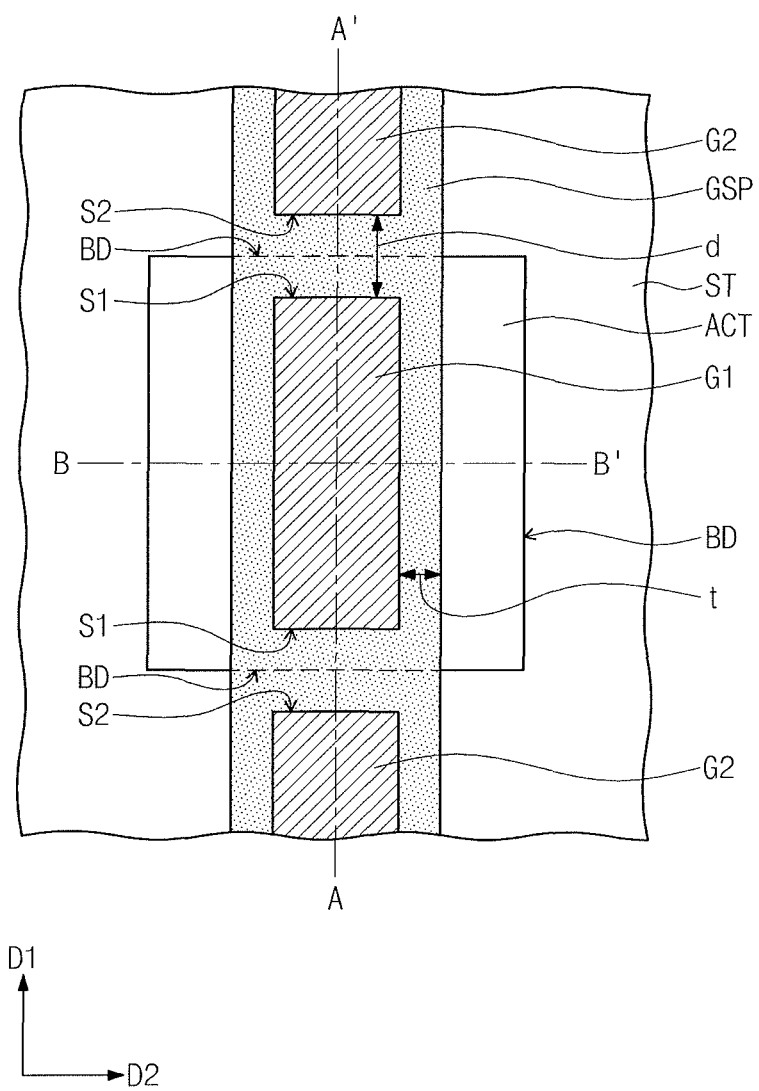
Figure 8:
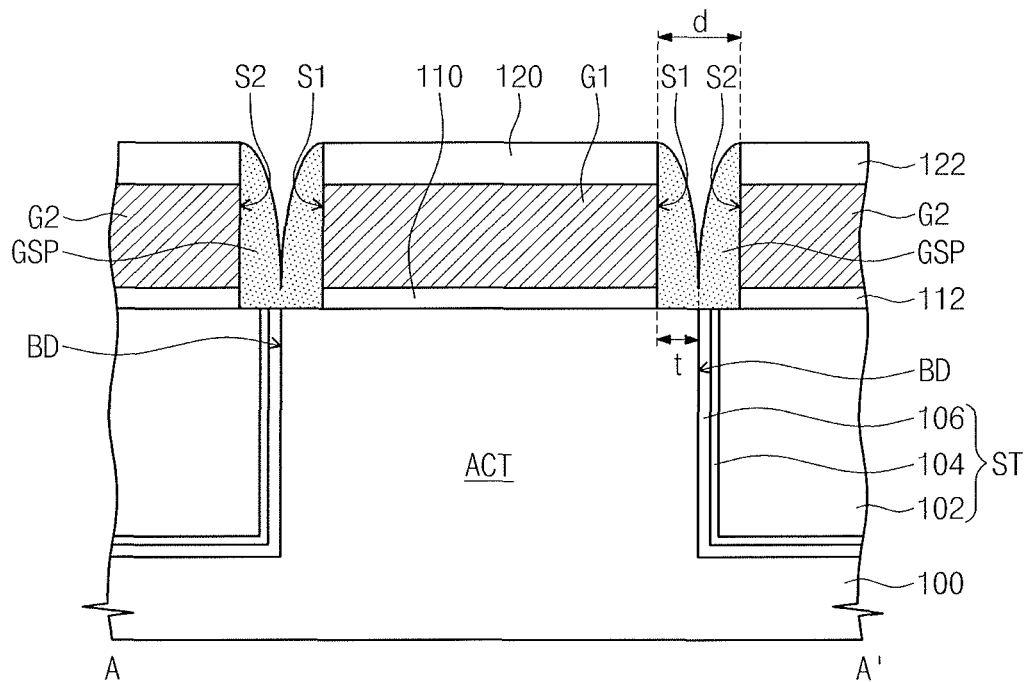
Figure 9:
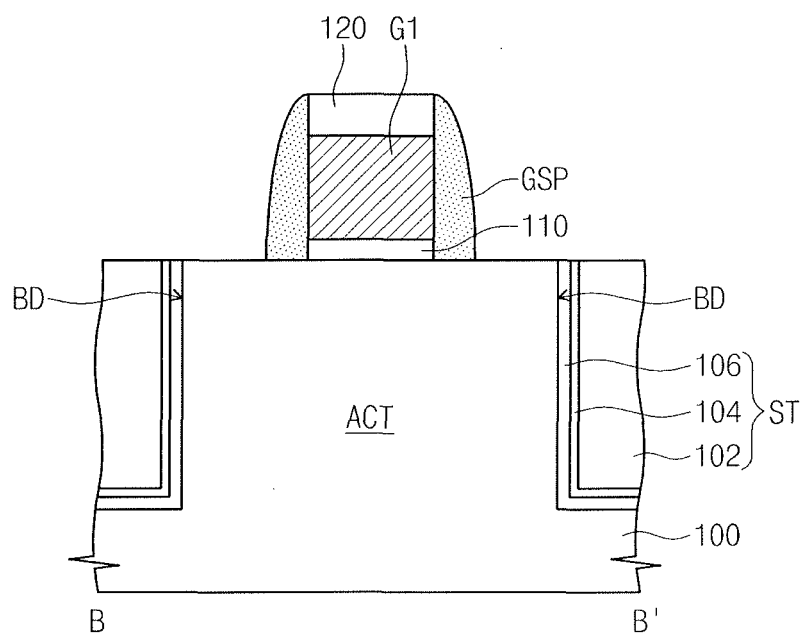

FIGS. 4 and 7 are plan views illustrating stages in a method of fabricating a semiconductor device, according to some embodiments. FIGS. 5 and 8 are sectional views taken along line A-A' of FIGS. 4 and 7, respectively, and FIGS. 6 and 9 are sectional views taken along line B-B' of FIGS. 4 and 7, respectively.

Referring to FIGS. 4 to 6, a trench T may be formed in the substrate 100 to define the active region ACT. The formation of the trench T may include forming a mask pattern on the substrate 100 to define a position and a shape of the active region ACT, and then anisotropically etching the substrate 100 using the mask pattern as an etch mask.

The device isolation layer ST may be formed in the trench T. The formation of the device isolation layer ST may include sequentially forming the first insulating layer 102, the second insulating layer 104, and the third insulating layer 106. e.g., directly, on the substrate 100 to fill the trench T. The second insulating layer 104 may be interposed between the substrate 100 and the first insulating layer 102, and the third insulating layer 106 may be interposed between the substrate 100 and the second insulating layer 104. The formation of the device isolation layer ST may include planarizing the first to third insulating layers 102, 104, and 106 to expose a top surface of the active region ACT. Accordingly, the device isolation layer ST may have a top surface that is substantially coplanar with that of the active region ACT.

The first gate electrode G1 may be formed on the active region ACT to extend in the first direction D1, and the second gate electrode G2 may be formed on the device isolation layer ST to be spaced apart from the first gate electrode G1 in the first direction D1. The formation of the first and second gate electrodes G1 and G2 may include forming a gate pattern on the substrate 100 to, e.g., continuously, extend in the first direction D1 across the active region ACT and the device isolation layer ST, and then patterning the gate pattern to divide the gate pattern into the first and second gate electrodes G1 and G2. The gate pattern may be formed of or include a doped semiconductor material (e.g., doped silicon) and may be formed to have a conductivity type different from that of the substrate 100. In some embodiments, the patterning of the gate pattern may include removing a portion of the gate pattern, which is formed on the boundary BD between the active region ACT and the device isolation layer ST. As a result, the first and second gate electrodes G1 and G2 may be spaced apart from each other (FIG. 5), and the boundary BD between the active region ACT and the device isolation layer ST may be positioned between the first and second gate electrodes G1 and G2.

The first gate dielectric pattern 110 may be formed between the first gate electrode G1 and the active region ACT, and the second gate dielectric pattern 112 may be formed between the second gate electrode G2 and the device isolation layer ST. The first gate capping pattern 120 and the second gate capping pattern 122 may be formed on top surfaces of the first and second gate electrodes G1 and G2, respectively. The formation of the first and second gate dielectric patterns 110 and 112 may include forming a gate dielectric pattern to extend along a bottom surface of the gate pattern, and patterning the gate dielectric pattern to divide the gate dielectric pattern into the first and second gate dielectric patterns 110 and 112. The gate dielectric pattern may be formed of or include, e.g., a silicon oxide layer. The formation of the first and second gate capping patterns 120 and 122 may include forming a gate capping pattern to extend along a top surface of the gate pattern and patterning the gate capping pattern to divide the gate capping pattern into the first and second gate capping patterns 120 and 122. The gate capping pattern may be formed of or include, e.g., a silicon nitride layer. The steps of patterning the gate dielectric pattern, the gate pattern, and the gate capping pattern may be performed in a manner of sequentially etching the gate capping pattern, the gate pattern, and the gate dielectric pattern formed on the substrate 100.

Referring to FIGS. 7 to 9, the gate spacer GSP may be formed to cover side surfaces of the first and second gate electrodes G1 and G2. The gate spacer GSP may be formed to fill at least a portion of a space between the first and second gate electrodes G1 and G2. For example, the gate spacer GSP may cover a first side surface S1 of the first gate electrode G1 and may extend into the space between the first and second gate electrodes G1 and G2 to cover a second side surface S2 of the second gate electrode G2. The first side surface S1 of the first gate electrode G1 may face the second side surface S2 of the second gate electrode G2 in the first direction D1. In some embodiments, the gate spacer GSP may be formed on the boundary BD between the active region ACT and the device isolation layer ST. For example, the gate spacer GSP may cover the first and second side surfaces S1 and S2 of the first and second gate electrodes G1 and G2 and may include a portion crossing the boundary BD between the first and second gate electrodes G1 and G2.

The formation of the gate spacer GSP may include forming a gate spacer layer on the substrate 100 to cover the first and second gate dielectric patterns 110 and 112, the first and second gate electrodes G1 and G2, and the first and second gate capping patterns 120 and 122, and then, anisotropically etching the gate spacer layer. The gate spacer layer may be formed of or include, e.g., a silicon nitride layer. For example, as illustrated in FIG. 7, a distance d along the first direction D1 between the first and second side surfaces S1 and S2 of the first and second gate electrodes G1 and G2 may be equal to or less than two times a thickness t of the gate spacer layer (i.e., d<=2t). Accordingly, the gate spacer layer may be formed to fill the space between the first and second gate electrodes G1 and G2. In this case, the anisotropic etching process is performed to prevent the active region ACT and the device isolation layer ST from being exposed between the first and second gate electrodes G1 and G2. For example, at the completion of the anisotropic etching process, a portion of the gate spacer layer remains on the, e.g., entire, bottom of the space separating the first and second gate electrodes G1 and G2 from each other, so the active region ACT and the device isolation layer ST are not exposed between the first and second gate electrodes G1 and G2. In other words, the boundary BD between the first and second gate electrodes G1 and G2 is not exposed at the completion of the anisotropic etching process. However, as illustrated in FIG. 7, the anisotropic etching process may be performed to expose top surfaces of the first and second gate capping patterns 120 and 122, a top surface of the active region ACT at both sides of the first gate electrode G1, and a top surface of the device isolation layer ST at both sides of the second gate electrode G2.

Referring back to FIGS. 1 to 3, the source/drain regions SD may be formed in the active region ACT at both sides of the first gate electrode G1. The source/drain regions SD may be spaced apart from each other in the second direction D2, and the first gate electrode G1 may be interposed between the source/drain regions SD. The formation of the source/drain regions SD may include performing an ion implantation process on the substrate 100. The source/drain regions SD may have a conductivity type that is different from that of the substrate 100 but is the same as that of the first gate electrode G1.

Thereafter, a gate contact may be formed to apply a gate voltage to the first gate electrode G1, and source/drain contacts may be formed to apply a source/drain voltage to the source/drain regions SD. In certain embodiments, the second gate electrode G2 may be a dummy gate electrode, to which no voltage is applied. For example, the second gate electrode G2 may be in an electrically isolated state.

Figure 10:
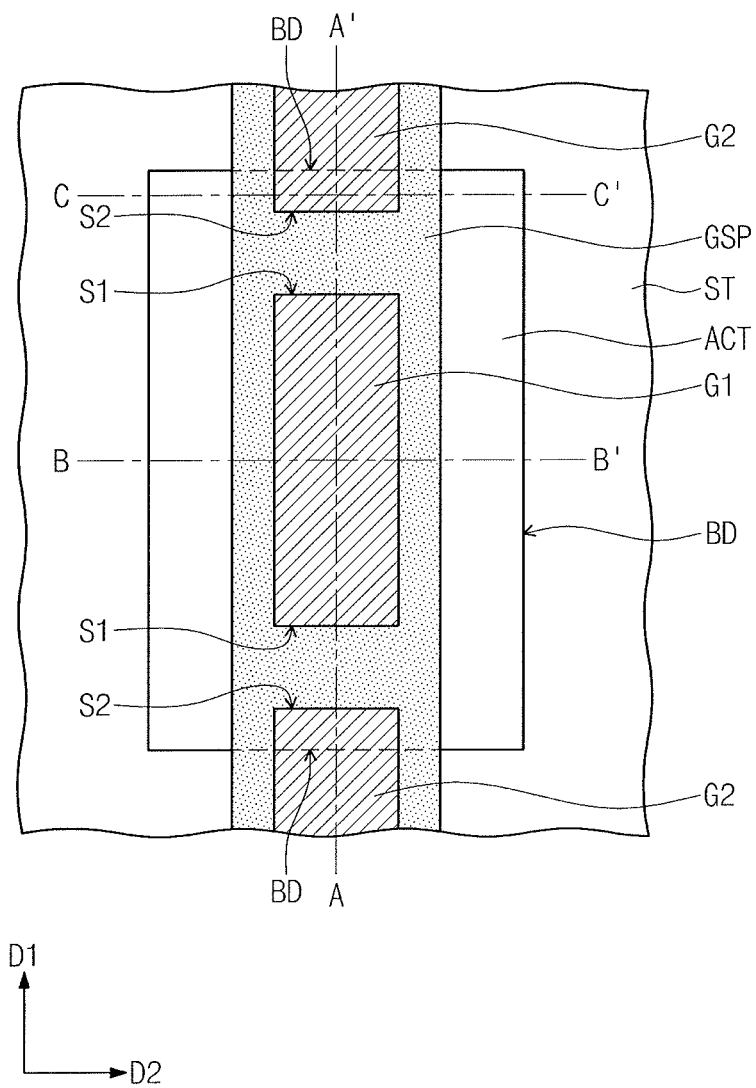
FIG. 10 illustrates a plan view of a semiconductor device according to some embodiments.
Figure 11:
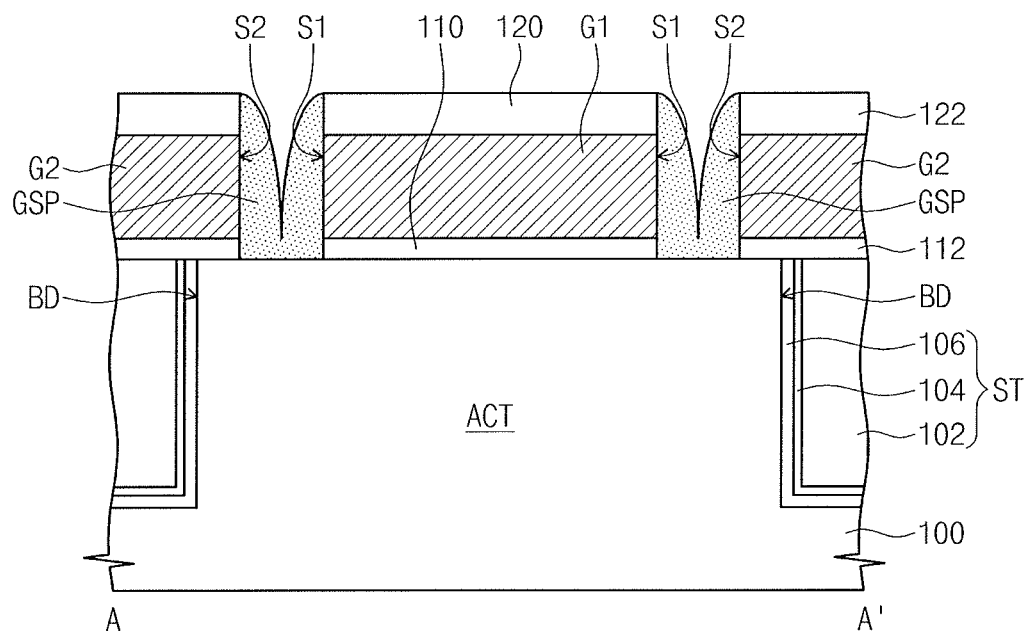
FIG. 11 illustrates a sectional view taken along line A-A' of FIG. 10.
Figure 12:
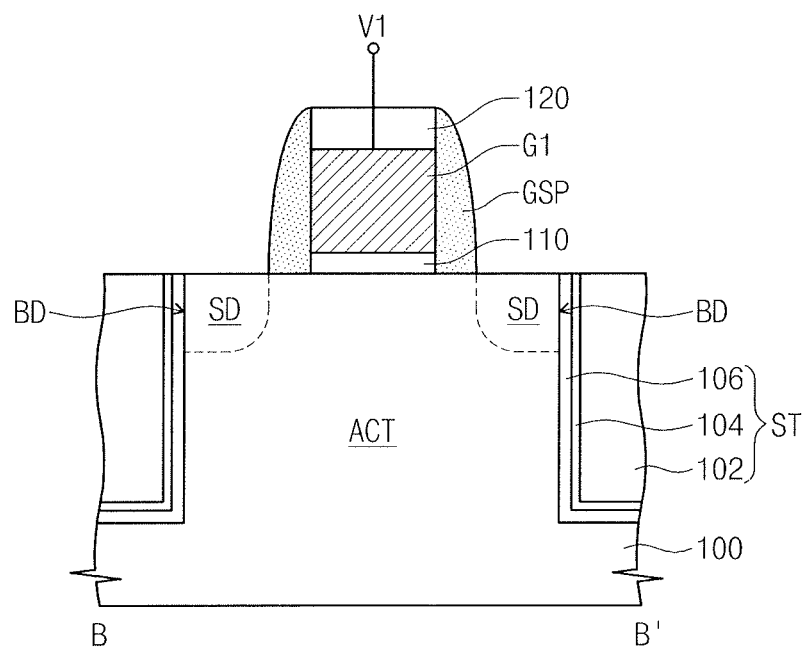
FIG. 12 illustrates a sectional view taken along line B-B' of FIG. 10.
Figure 13:
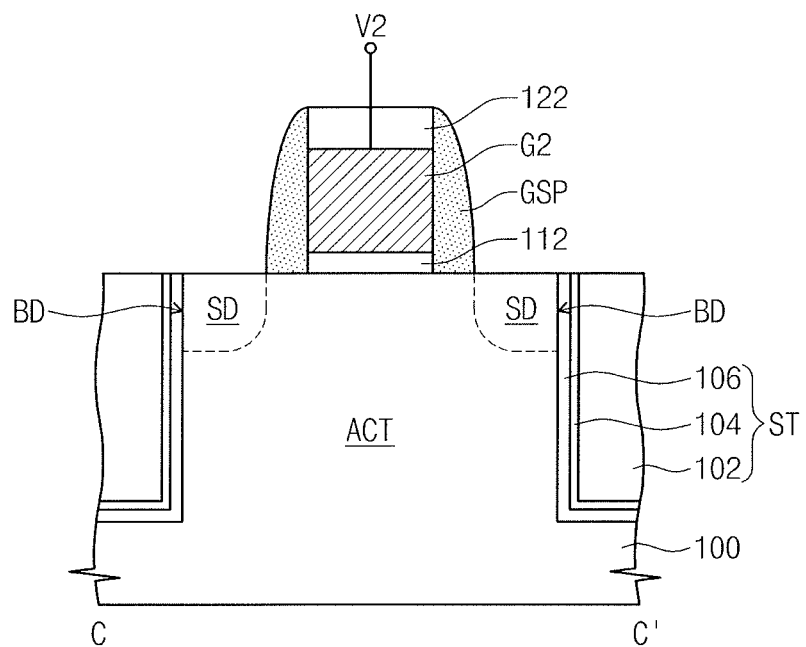
FIG. 13 illustrates a sectional view taken along line C-C' of FIG. 10.

FIG. 10 is a plan view illustrating a semiconductor device according to some embodiments. FIGS. 11, 12, and 13 are sectional views taken along lines A-A', B-B', and C-C', respectively, of FIG. 10. For concise description, an element previously described with reference to FIGS. 1 to 3 may be identified by a similar or identical reference number without repeating an overlapping description thereof.

Referring to FIGS. 10 to 13, the device isolation layer ST may be provided on the substrate 100 to define the active region ACT. The device isolation layer ST may include the first insulating layer 102 surrounding side surfaces of the active region ACT, the second insulating layer 104 between the first insulating layer 102 and the side surfaces of the active region ACT, and the third insulating layer 106 between the second insulating layer 104 and the side surfaces of the active region ACT.

The first gate electrode G1 may be provided on the active region ACT to extend in the first direction D1. The first gate electrode G1 may be locally provided on the top surface of the active region ACT. In other words, when viewed in a plan view, the first gate electrode G1 may not be overlapped with the boundary BD between the active region ACT and the device isolation layer ST. The second gate electrode G2 may be provided on the device isolation layer ST to be spaced apart from the first gate electrode G1 in the first direction D1. The second gate electrode G2 may extend from the top surface of the device isolation layer ST to the top surface of the active region ACT and thus may cross the boundary BD between the active region ACT and the device isolation layer ST. For example, the second gate electrode G2 may include a portion that is located on the boundary BD between the active region ACT and the device isolation layer ST.

The gate spacer GSP may be provided between the first and second gate electrodes G1 and G2. The gate spacer GSP may cover the first side surface S1 of the first gate electrode G1 and may extend into a space between the first and second gate electrodes G1 and G2 to cover the second side surface S2 of the second gate electrode G2. The first side surface S1 of the first gate electrode G1 may face the second side surface S2 of the second gate electrode G2 in the first direction D1. Accordingly, a portion of the top surface of the active region ACT located between the first and second gate electrodes G1 and G2 may be covered with the gate spacer GSP. The gate spacer GSP may be extended to cover other side surfaces of the first and second gate electrodes G1 and G2.

The first gate dielectric pattern 110 may be provided between the first gate electrode G1 and the active region ACT to extend along a bottom surface of the first gate electrode G1. The first gate capping pattern 120 may be provided on and along a top surface of the first gate electrode G1. The second gate dielectric pattern 112 may be provided between the second gate electrode G2 and the device isolation layer ST. The second gate dielectric pattern 112 may extend along a bottom surface of the second gate electrode G2 and may be interposed between the second gate electrode G2 and the active region ACT. The second gate capping pattern 122 may be provided on and along a top surface of the second gate electrode G2. The gate spacer GSP may be extended from the side surfaces of the first gate electrode G1 to cover side surfaces of the first gate dielectric pattern 110 and the first gate capping pattern 120. Also, the gate spacer GSP may be extended from the side surfaces of the second gate electrode G2 to cover side surfaces of the second gate dielectric pattern 112 and the second gate capping pattern 122.

The first and second gate electrodes G1 and G2 may be formed of or include a doped semiconductor material. The second gate electrode G2 may have the same conductivity type as that of the first gate electrode G1, and the first and second gate electrodes G1 and G2 may have a conductivity type different from that of the substrate 100.

The source/drain regions SD may be provided in the active region ACT at both sides of the first gate electrode G1. The source/drain regions SD may extend in the first direction D1 to be provided in the active region ACT at both sides of the second gate electrode G2. The source/drain regions SD may be spaced apart from each other in the second direction D2. The source/drain regions SD may have a conductivity type that is different from that of the substrate 100 but is the same as those of the first and second gate electrodes G1 and G2.

As an example, a conductivity type of the substrate 100 may be an n-type, and a conductivity type of each of the first and second gate electrodes G1 and G2 and the source/drain regions SD may be a p-type. For example, the first gate electrode G1 and the source/drain regions SD may constitute a first PMOS transistor, and the second gate electrode G2 and the source/drain regions SD may constitute a second PMOS transistor. In this case, threshold voltages (Vth1 and Vth2) of the first and second PMOS transistors may be negative (i.e., Vth1<0 and Vth2<0).

A first gate voltage V1 applied to the first gate electrode G1 may be lower than the threshold voltage Vth1 of the first PMOS transistor (i.e., V1<Vth1<0). In this case, a channel may be formed in the active region ACT of the first PMOS transistor. That is, an absolute value of the first gate voltage V1 may be greater than that of the threshold voltage Vth1 of the first PMOS transistor. A second gate voltage V2 applied to the second gate electrode G2 may be higher than the threshold voltage Vth2 of the second PMOS transistor (i.e., Vth2<V2). In this case, it is possible to prevent the channel from being formed in the active region ACT of the second PMOS transistor. For example, the second gate voltage V2 may be a negative voltage, which is higher than the threshold voltage Vth2 of the second PMOS transistor (i.e., Vth2<V2<0), or a zero or positive voltage (i.e., 0≤V2). In the case where the second gate voltage V2 is a negative voltage, an absolute value of the second gate voltage V2 may be smaller than that of the threshold voltage Vth2 of the second PMOS transistor.

In certain embodiments, a conductivity type of the substrate 100 may be a p-type, and a conductivity type of each of the first and second gate electrodes G1 and G2 and the source/drain regions SD may be an n-type. For example, the first gate electrode G1 and the source/drain regions SD may constitute a first NMOS transistor, and the second gate electrode G2 and the source/drain regions SD may constitute a second NMOS transistor. In this case, threshold voltages Vth1 and Vth2 of the first and second NMOS transistors may be positive (i.e., 0<Vth1 and 0<Vth2).

In this case, the first gate voltage V1 applied to the first gate electrode G1 may be higher than the threshold voltage Vth1 of the first NMOS transistor (i.e., 0<Vth1<V1). As a result, a channel may be formed in the active region ACT of the first NMOS transistor. The second gate voltage V2 applied to the second gate electrode G2 may be lower than the threshold voltage Vth2 of the second NMOS transistor (i.e., V2<Vth2). In this case, it is possible to prevent the channel from being formed in the active region ACT of the second NMOS transistor. In other words, the second gate voltage V2 may be a positive voltage, which is lower than the threshold voltage Vth2 of the second NMOS transistor (i.e., 0<V2<Vth2), or a zero or negative voltage (i.e., V2≤0).

According to the present embodiments, when viewed in a plan view, the first gate electrode G1 may not overlap the boundary BD of the active region ACT and the device isolation layer ST, and the second gate electrode G2 may be on the boundary BD between the active region ACT and the device isolation layer ST. Furthermore, by controlling a voltage applied to the second gate electrode G2 (i.e., the second gate voltage V2), channel formation in the active region ACT below the second gate electrode G2 may be reduced or prevented. In other words,t a current flow at a boundary region between the active region ACT and the device isolation layer ST may be reduced or prevented, thus reducing or preventing the HEIP phenomenon. This may make it possible to improve electric characteristics of the semiconductor device including the first and second gate electrodes G1 and G2.

Figure 14:
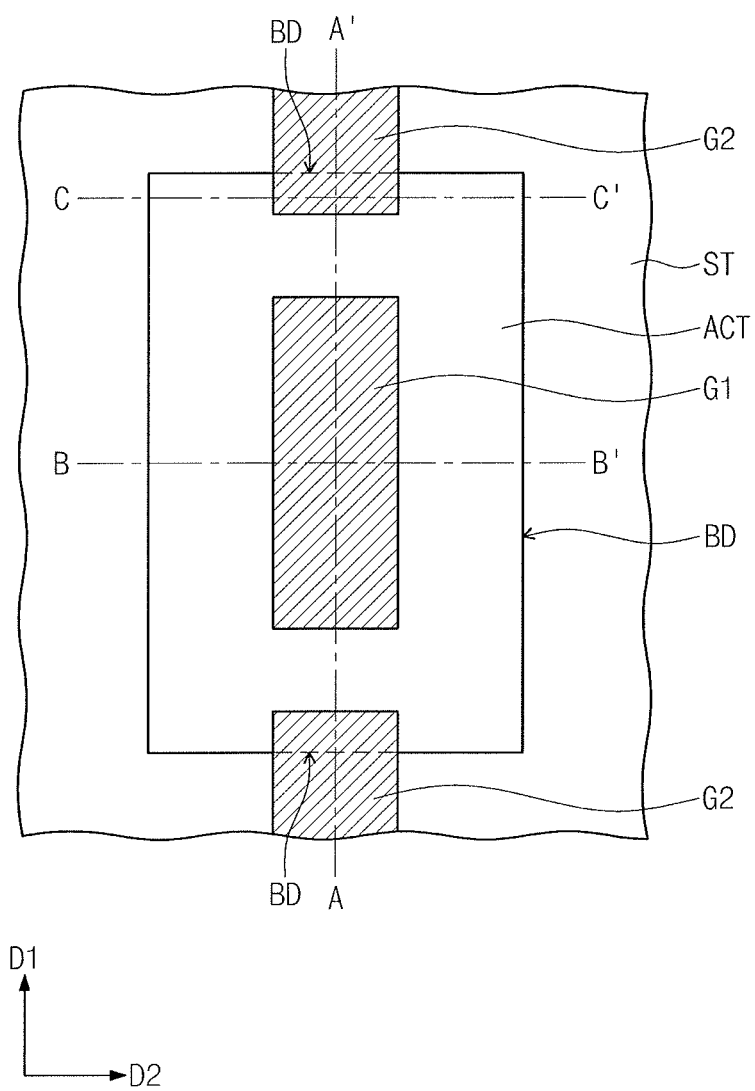
FIG. 14 illustrates a plan view of a method of fabricating a semiconductor device, according to some embodiments.
Figure 15:
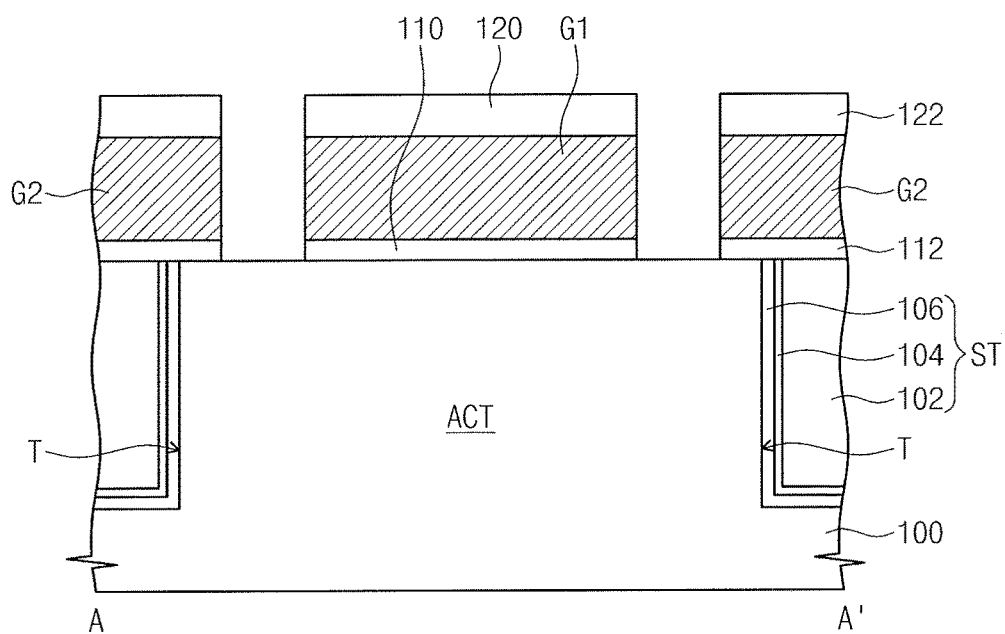
FIG. 15 illustrates a sectional view taken along line A-A' of FIG. 14.
Figure 16:
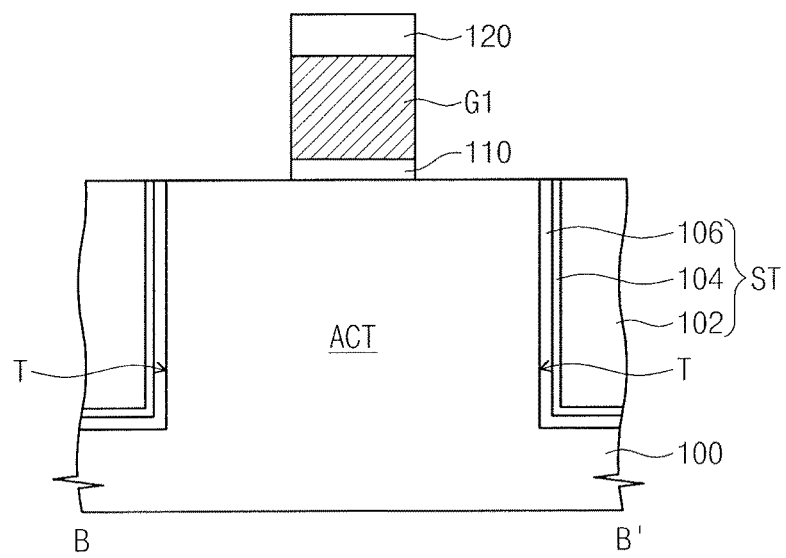
FIG. 16 illustrates a sectional view taken along line B-B' of FIG. 14.
Figure 17:
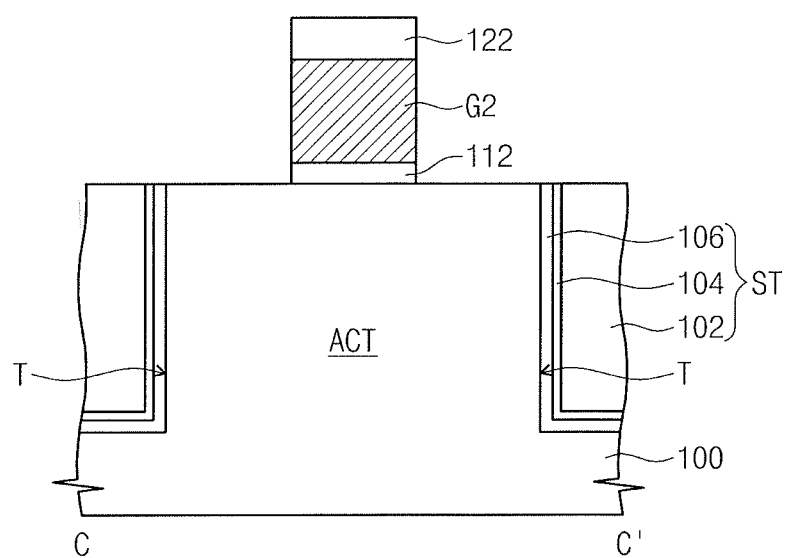
FIG. 17 illustrates a sectional view taken along line C-C' of FIG. 14.

FIG. 14 is a plan view illustrating a method of fabricating a semiconductor device, according to some embodiments. FIGS. 15, 16, and 17 are sectional views taken along lines A-A', B-B', and C-C', respectively, of FIG. 14. For concise description, an element or step previously described with reference to FIGS. 4 to 9 may be identified by a similar or identical reference number without repeating an overlapping description thereof.

Referring to FIGS. 14 to 17, the trench T may be formed in the substrate 100 to define the active region ACT. The device isolation layer ST may be formed in the trench T. The formation of the device isolation layer ST may include sequentially forming the first insulating layer 102, the second insulating layer 104, and the third insulating layer 106 on the substrate 100 to fill the trench T. The second insulating layer 104 may be interposed between the substrate 100 and the first insulating layer 102, and the third insulating layer 106 may be interposed between the substrate 100 and the second insulating layer 104. The formation of the device isolation layer ST may include planarizing the first to third insulating layers 102, 104, and 106 to expose the top surface of the active region ACT.

The first gate electrode G1 may be formed on the active region ACT to extend in the first direction D1, and the second gate electrode G2 may be formed on the device isolation layer ST to be spaced apart from the first gate electrode G1 in the first direction D1. The second gate electrode G2 may be formed to extend from the top surface of the device isolation layer ST to the top surface of the active region ACT and thereby to cross the boundary BD between the active region ACT and the device isolation layer ST. The formation of the first and second gate electrodes G1 and G2 may include forming a gate pattern on the substrate 100 to extend in the first direction D1 across the active region ACT and the device isolation layer ST, and then, patterning the gate pattern to divide the gate pattern into the first and second gate electrodes G1 and G2. The gate pattern may be formed of or include a doped semiconductor material (e.g., doped silicon) and may be formed to have a conductivity type different from that of the substrate 100. The patterning of the gate pattern may include removing a portion of the gate pattern overlapped with the active region ACT. Accordingly, the second gate electrode G2 may be formed on the boundary BD between the active region ACT and the device isolation layer ST. The first and second gate electrodes G1 and G2 may have the same conductivity type.

The first gate dielectric pattern 110 may be formed between the first gate electrode G1 and the active region ACT, and the second gate dielectric pattern 112 may be formed between the second gate electrode G2 and the device isolation layer ST. The second gate dielectric pattern 112 may extend along a bottom surface of the second gate electrode G2, and thus it may include a portion interposed between the second gate electrode G2 and the active region ACT. The first gate capping pattern 120 and the second gate capping pattern 122 may be formed on top surfaces of the first and second gate electrodes G1 and G2, respectively. The first and second gate dielectric patterns 110 and 112 and the first and second gate capping patterns 120 and 122 may be formed in substantially the same manner as those of the method previously described with reference to FIGS. 4 to 9.

Referring back to FIGS. 10 to 13, the gate spacer GSP may be formed to cover side surfaces of the first and second gate electrodes G1 and G2. The gate spacer GSP may be formed to fill at least a portion of a space between the first and second gate electrodes G1 and G2. For example, the gate spacer GSP may cover the first side surface S1 of the first gate electrode G1 and may extend into the space between the first and second gate electrodes G1 and G2 to cover the second side surface S2 of the second gate electrode G2. The first side surface S1 of the first gate electrode G1 may face the second side surface S2 of the second gate electrode G2 in the first direction D1. A portion of the top surface of the active region ACT located between the first and second gate electrodes G1 and G2 may be covered with the gate spacer GSP. The gate spacer GSP may be formed in substantially the same manner as those of the method previously described with reference to FIGS. 4 to 9.

The source/drain regions SD may be formed in the active region ACT at both sides of the first gate electrode G1. The source/drain regions SD may extend in the first direction D1 and may be formed in the active region ACT at both sides of the second gate electrode G2. The formation of the source/drain regions SD may include performing an ion implantation process on the substrate 100. The source/drain regions SD may have a conductivity type that is different from that of the substrate 100 but is the same as those of the first and second gate electrodes G1 and G2.

Thereafter, gate contacts may be formed to apply gate voltages to the first and second gate electrodes G1 and G2, respectively, and source/drain contacts may be formed to apply source/drain voltages to the source/drain regions SD.

Figure 18:
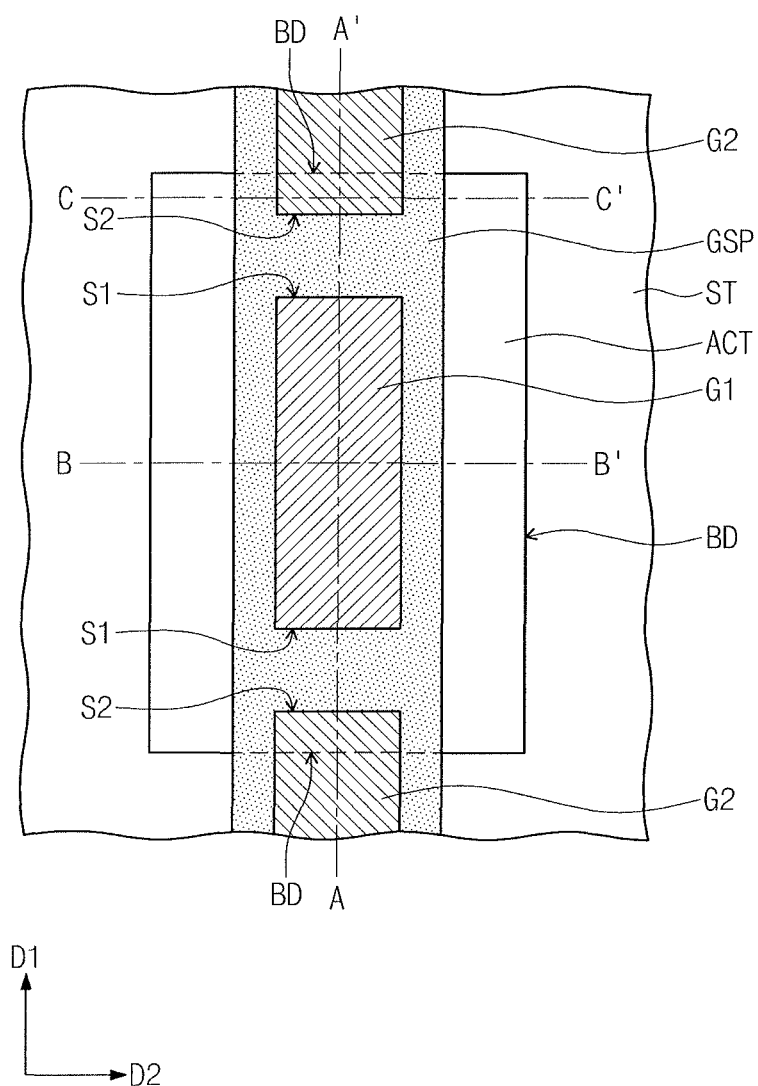
FIG. 18 illustrates a plan view of a semiconductor device according to some embodiments.
Figure 19:
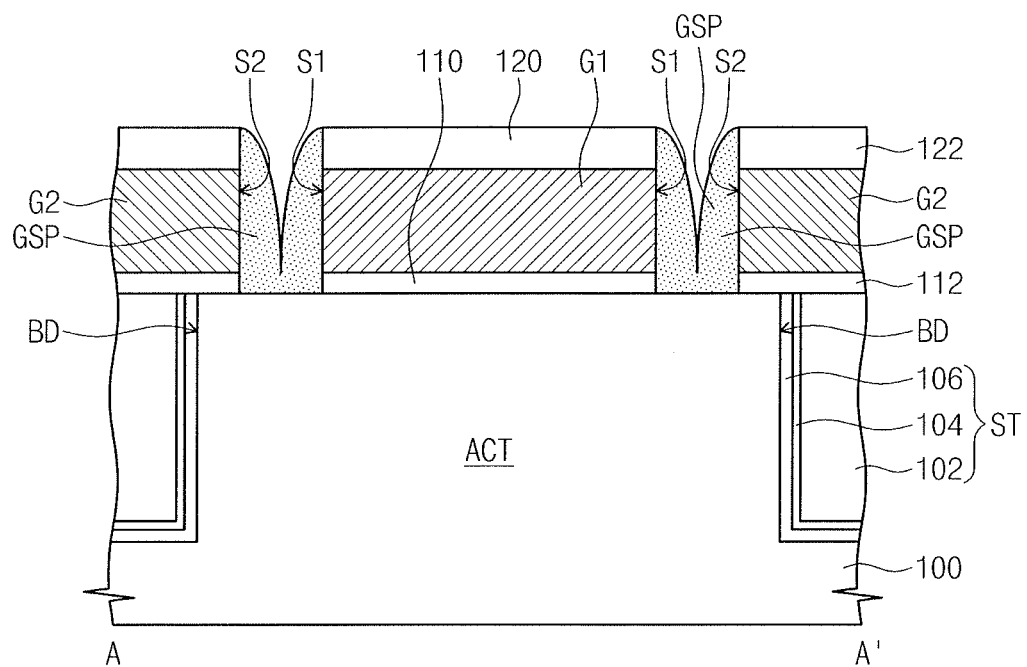
FIG. 19 illustrates a sectional view taken along line A-A' of FIG. 18.
Figure 20:
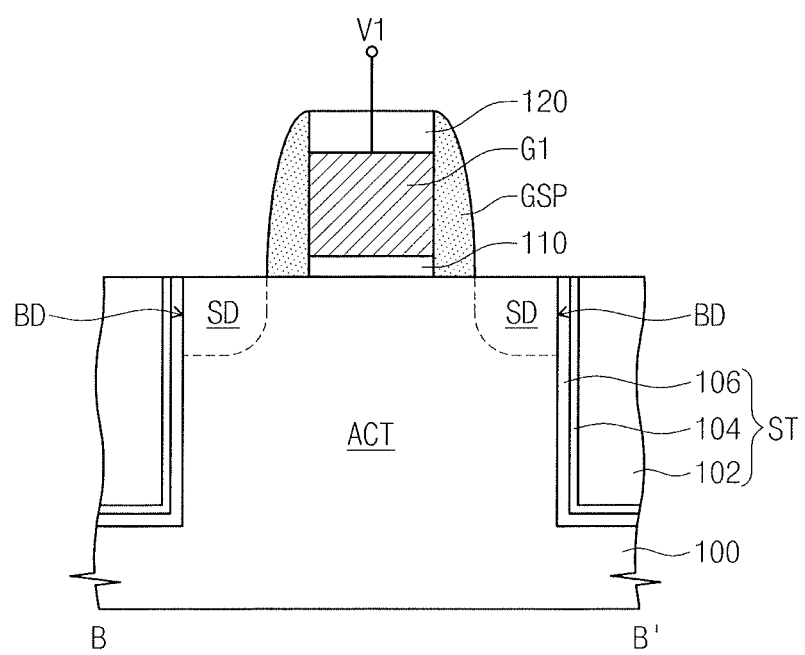
FIG. 20 illustrates sectional view taken along line B-B' of FIG. 18.
Figure 21:
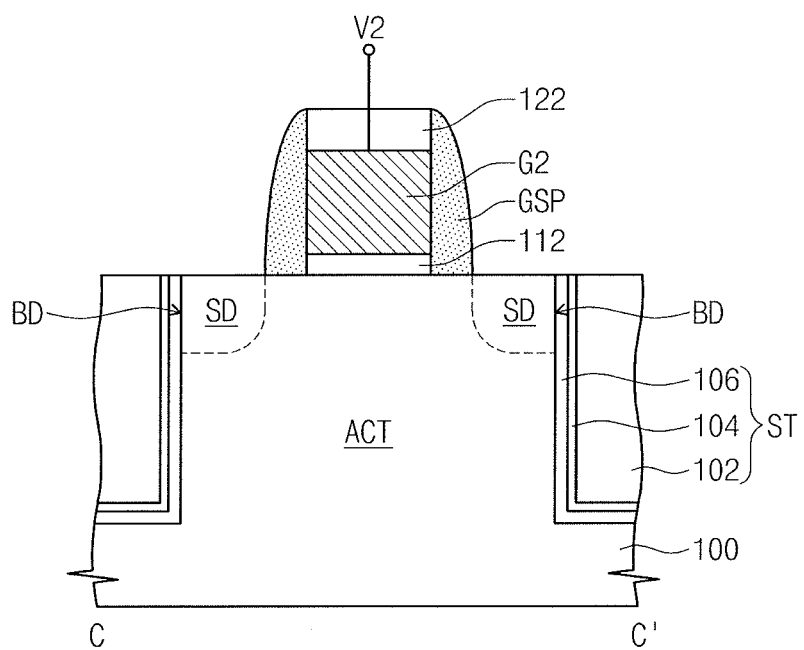
FIG. 21 illustrates a sectional view taken along line C-C' of FIG. 18.

FIG. 18 is a plan view illustrating a semiconductor device according to some embodiments. FIGS. 19, 20, and 21 are sectional views taken along lines A-A', B-B', and C-C', respectively, of FIG. 18. For concise description, an element previously described with reference to FIGS. 10 to 13 may be identified by a similar or identical reference number without repeating an overlapping description thereof.

Referring to FIGS. 18 to 21, the first and second gate electrodes G1 and G2 may be formed of or include a doped semiconductor material. The second gate electrode G2 may have a conductivity type different from that of the first gate electrode G1. The first gate electrode G1 may have a conductivity type different from that of the substrate 100, and the second gate electrode G2 may have the same conductivity type as that of the substrate 100.

The source/drain regions SD may be provided in the active region ACT at both sides of the first gate electrode G1. The source/drain regions SD may extend in the first direction D1 to be provided in the active region ACT at both sides of the second gate electrode G2. The source/drain regions SD may be spaced apart from each other in the second direction D2. The source/drain regions SD may have a conductivity type different from that of the substrate 100. The source/drain regions SD may have the same conductivity type as that of the first gate electrode G1 and may have a conductivity type different from that of the second gate electrode G2.

As an example, a conductivity type of each of the substrate 100 and the second gate electrode G2 may be an n-type, and a conductivity type of each of the first gate electrode G1 and the source/drain regions SD may be a p-type. In other words, the first gate electrode G1 and the source/drain regions SD may constitute a first PMOS transistor with a p-type gate electrode, and the second gate electrode G2 and the source/drain regions SD may constitute a second PMOS transistor with an n-type gate electrode. In this case, the first and second PMOS transistors may have negative threshold voltages Vth1 and Vth2 (i.e., Vth1<0 and Vth2<0), and the threshold voltage Vth2 of the second PMOS transistor may be lower than the threshold voltage Vth1 of the first PMOS transistor (i.e., Vth2<Vth1<0). In other words, an absolute value of the threshold voltage Vth2 of the second PMOS transistor may be greater than that of the threshold voltage Vth1 of the first PMOS transistor.

A first gate voltage V1 applied to the first gate electrode G1 may be lower than the threshold voltage Vth1 of the first PMOS transistor (i.e., V1<Vth1<0). In this case, a channel may be formed in the active region ACT of the first PMOS transistor. That is, an absolute value of the first gate voltage V1 may be greater than that of the threshold voltage Vth1 of the first PMOS transistor. A second gate voltage V2 applied to the second gate electrode G2 may be higher than the threshold voltage Vth2 of the second PMOS transistor (i.e., Vth2<V2). In this case, it is possible to prevent the channel from being formed in the active region ACT of the second PMOS transistor. For example, the second gate voltage V2 may be a negative voltage, which is higher than the threshold voltage Vth2 of the second PMOS transistor (i.e., Vth2<V2<0), or a zero or positive voltage (i.e., 0≤V2). In the case where the second gate voltage V2 is a negative voltage, an absolute value of the second gate voltage V2 may be smaller than that of the threshold voltage Vth2 of the second PMOS transistor.

As another example, a conductivity type of each of the substrate 100 and the second gate electrode G2 may be a p-type, and a conductivity type of each of the first gate electrode G1 and the source/drain regions SD may be an n-type. For example, the first gate electrode G1 and the source/drain regions SD may constitute a first NMOS transistor with an n-type gate electrode, and the second gate electrode G2 and the source/drain regions SD may constitute a second NMOS transistor with a p-type gate electrode. In this case, the first and second NMOS transistors may have positive threshold voltages Vth1 and Vth2 (i.e., 0<Vth1 and 0<Vth2), and the threshold voltage Vth2 of the second NMOS transistor may be higher than the threshold voltage Vth1 of the first NMOS transistor (i.e., 0<Vth1<Vth2).

The first gate voltage V1 applied to the first gate electrode G1 may be higher than the threshold voltage Vth1 of the first NMOS transistor (i.e., 0<Vth1<V1). In this case, a channel may be formed in the active region ACT of the first NMOS transistor. The second gate voltage V2 applied to the second gate electrode G2 may be lower than the threshold voltage Vth2 of the second NMOS transistor (i.e., V2<Vth2). In this case, it is possible to prevent the channel from being formed in the active region ACT of the second NMOS transistor. In other words, the second gate voltage V2 may be a positive voltage, which is lower than the threshold voltage Vth2 of the second NMOS transistor (i.e., 0<V2<Vth2), or a zero or negative voltage (i.e., V2≤0).

According to the present embodiments, the second gate electrode G2 may have a conductivity type different from that of the first gate electrode G1, and thus, transistors controlled by the first and second gate electrodes G1 and G2 may have different threshold voltages. Accordingly, even when the first and second gate electrodes G1 and G2 are applied with the same voltage (i.e., V1=V2), it is possible to prevent a channel from being formed in the active region ACT below the second gate electrode G2. In other words, it is possible to prevent a current flow from being created at a boundary region between the active region ACT and the device isolation layer ST and consequently to prevent the HEIP phenomenon. This may make it possible to improve electric characteristics of the semiconductor device including the first and second gate electrodes G1 and G2.

Figure 22:
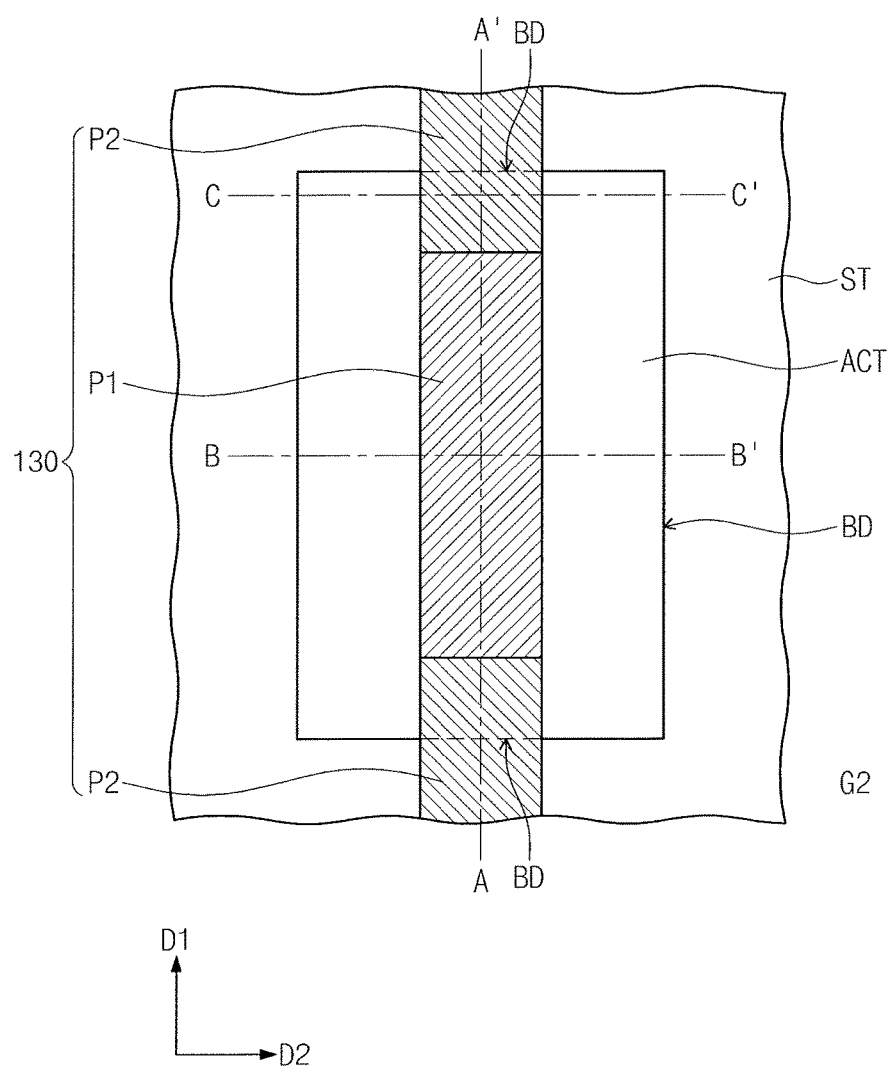
FIGS. 22 and 26 illustrate plan views of stages in a method of fabricating a semiconductor device, according to some embodiments.
Figure 23:
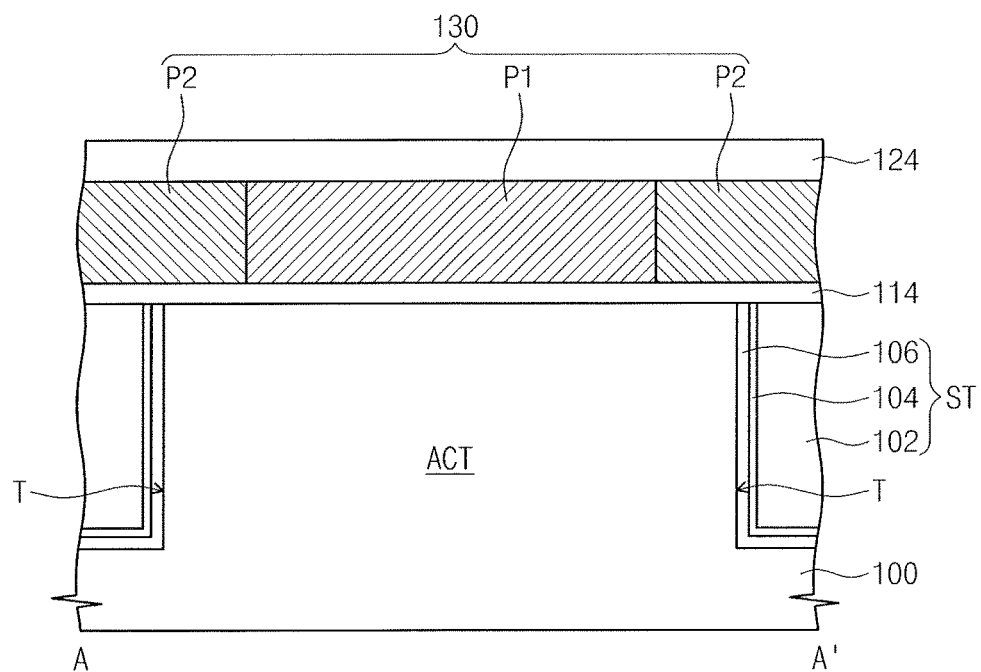
FIGS. 23 and 27 illustrate sectional views taken along line A-A' of FIGS. 22 and 26, respectively.
Figure 24:
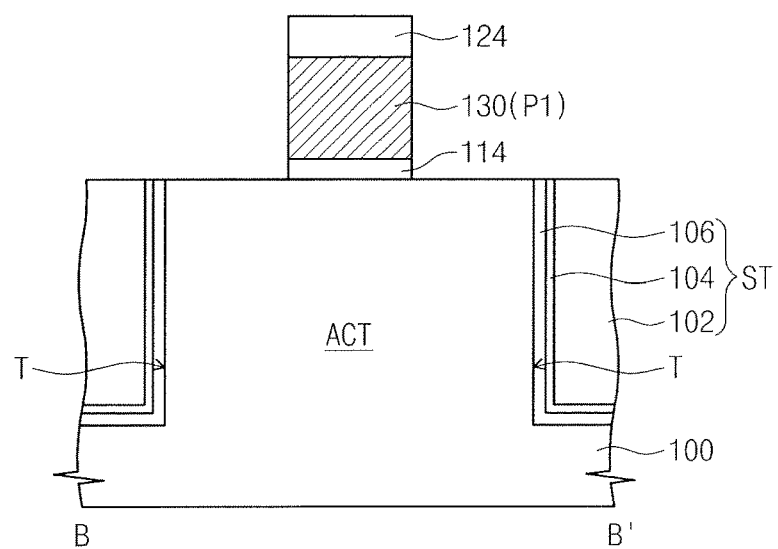
FIGS. 24 and 28 illustrate sectional views taken along line B-B' of FIGS. 22 and 26, respectively.
Figure 25:
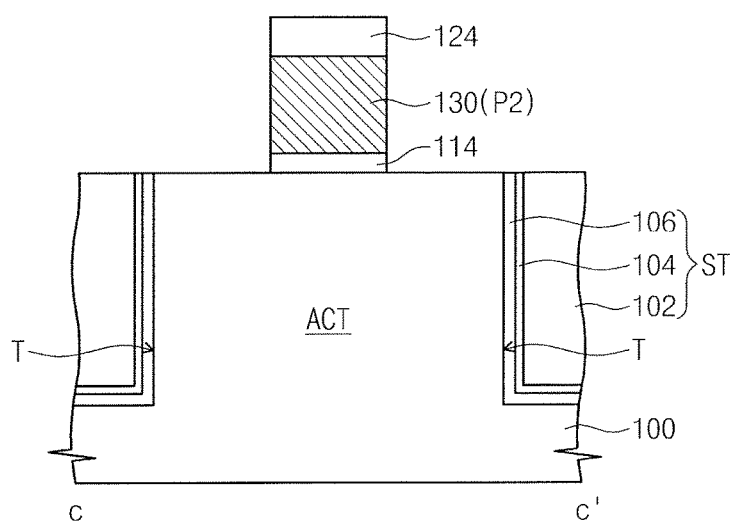
FIGS. 25 and 29 illustrate sectional views taken along line C-C' of FIGS. 22 and 26, respectively.
Figure 26:
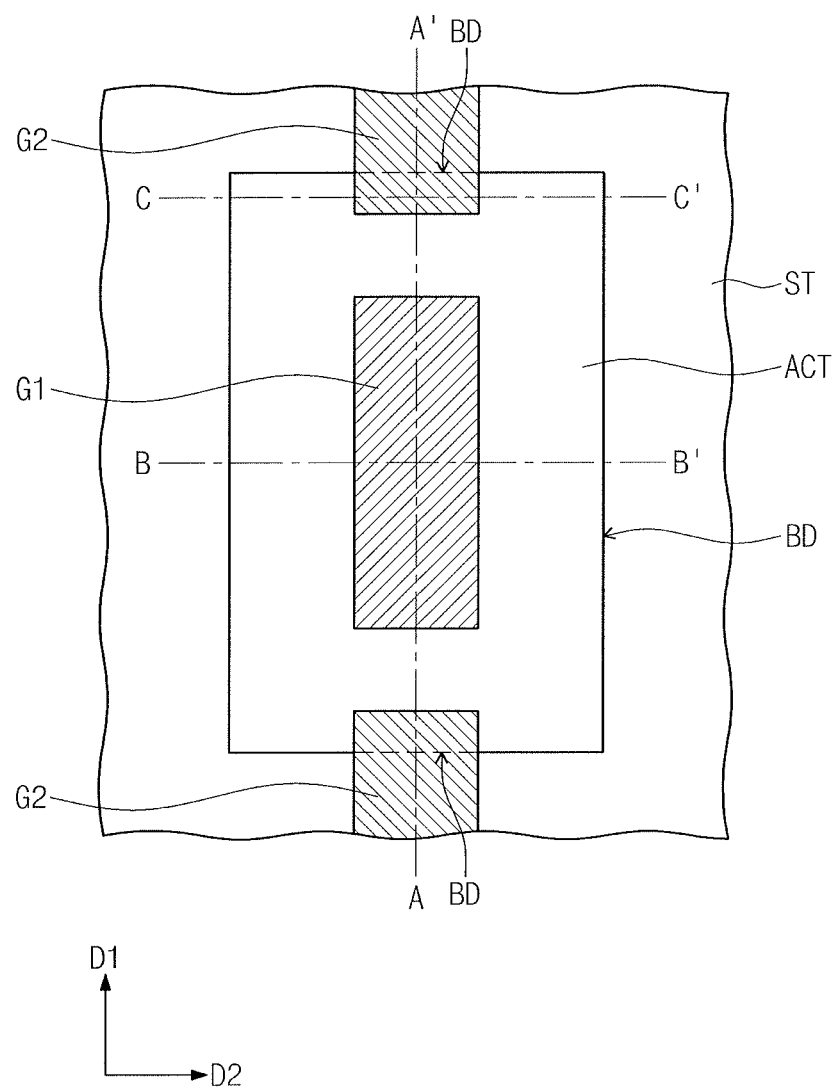
Figure 27:
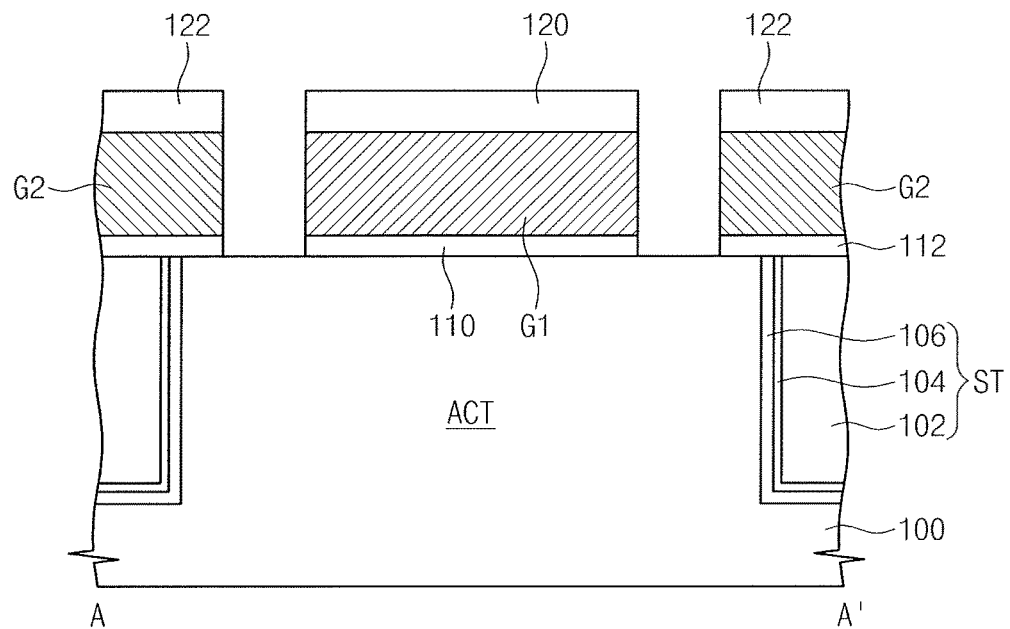
Figure 28:
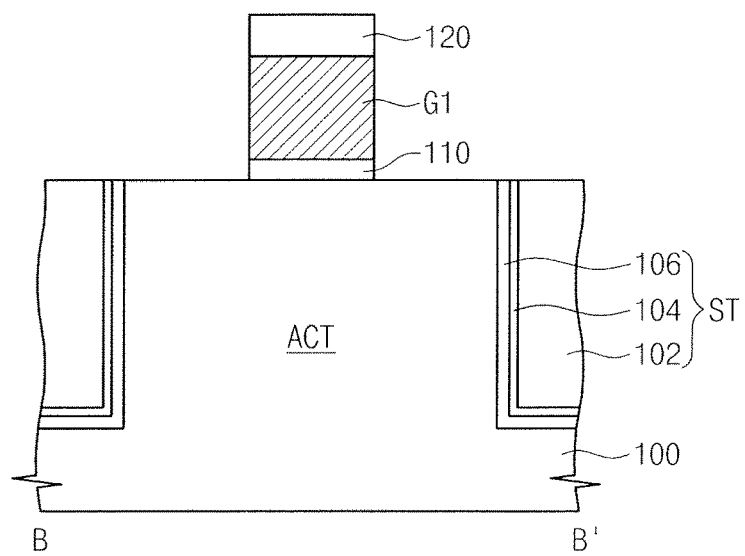
Figure 29:
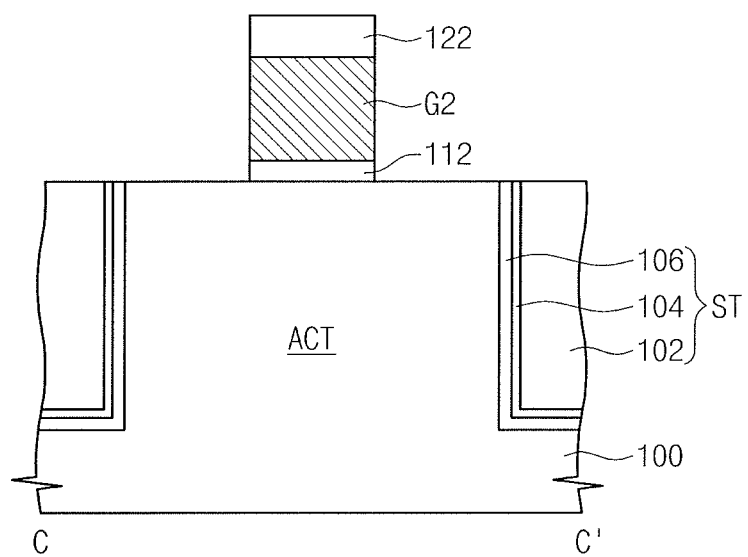

FIGS. 22 and 26 are plan views illustrating a method of fabricating a semiconductor device, according to some embodiments. FIGS. 23 and 27 are sectional views taken along line A-A' of FIGS. 22 and 26, respectively, FIGS. 24 and 28 are sectional views taken along line B-B' of FIGS. 22 and 26, respectively, and FIGS. 25 and 29 are sectional views taken along line C-C' of FIGS. 22 and 26, respectively. For concise description, an element or step previously described with reference to FIGS. 14 to 17 may be identified by a similar or identical reference number without repeating an overlapping description thereof.

Referring to FIGS. 22 to 25, a gate pattern 130 may be formed to cross the active region ACT and the device isolation layer ST and to extend in the first direction D1. The gate pattern 130 may be formed to cross the boundary BD between the active region ACT and the device isolation layer ST. The gate pattern 130 may include first and second portions P1 and P2, whose conductivity types are different from each other. The first portion P1 may be a doped region of a first conductivity type, and the second portion P2 may be a doped region of a second conductivity type. One of the first and second conductivity types may be a p-type, and the other may be an n-type. The first portion P1 of the gate pattern 130 may be provided on the active region ACT, and the second portion P2 of the gate pattern 130 may be provided on the boundary BD between the active region ACT and the device isolation layer ST. A gate dielectric pattern 114 may be formed between the gate pattern 130 and the substrate 100. The gate dielectric pattern 114 may extend along a bottom surface of the gate pattern 130. A gate capping pattern 124 extending along a top surface of the gate pattern 130 may be formed on the top surface of the gate pattern 130.

The formation of the gate dielectric pattern 114 and the gate pattern 130 may include forming a gate dielectric layer on the substrate 100, forming a gate layer of a first conductivity type on the gate dielectric layer, forming a mask pattern on the gate layer to define an opening exposing a portion of a top surface of the gate layer, injecting impurities of a second conductivity type into the gate layer using the mask pattern as an ion injection mask, removing the mask pattern, forming the gate capping pattern 124 on the gate layer to define a position and shape of the gate pattern, and then sequentially etching the gate layer and the gate dielectric layer using the gate capping pattern 124 as an etch mask.

Referring to FIGS. 26 to 29, a patterning process may be performed to divide the gate pattern 130 into the first gate electrode G1 and the second gate electrode G2. The patterning of the gate pattern 130 may include removing a portion of the gate pattern 130 from a boundary between the first and second portions P1 and P2. In some embodiments, the first gate electrode G1 may include the first portion P1 of the gate pattern 130, and the second gate electrode G2 may include the second portion P2 of the gate pattern 130. In other words, the first and second gate electrodes G1 and G2 may have conductivity types different from each other. The first gate electrode G1 may be provided on the active region ACT to extend in the first direction D1. The first gate electrode G1 may be locally formed on a top surface of the active region ACT. In other words, when viewed in a plan view, the first gate electrode G1 may not be overlapped with the boundary BD between the active region ACT and the device isolation layer ST. The second gate electrode G2 may be provided on the device isolation layer ST and may be spaced apart from the first gate electrode G1 in the first direction D1. The second gate electrode G2 may be formed to extend from a top surface of the device isolation layer ST to a top surface of the active region ACT and thereby to cross the boundary BD between the active region ACT and the device isolation layer ST.

The gate dielectric pattern 114 may be patterned to form the first gate dielectric pattern 110 and the second gate dielectric pattern 112 that are spaced apart from each other. The first gate dielectric pattern 110 may be interposed between the first gate electrode G1 and the active region ACT. The second gate dielectric pattern 112 may be interposed between the second gate electrode G2 and the device isolation layer ST, and in certain embodiments, the second gate dielectric pattern 112 may be extended along a bottom surface of the second gate electrode G2, thereby including a portion interposed between the second gate electrode G2 and the active region ACT. The gate capping pattern 124 may be patterned to form the first gate capping pattern 120 and the second gate capping pattern 122 that are spaced apart from each other. The first and second gate capping patterns 120 and 122 may be formed on the top surfaces of the first and second gate electrodes G1 and G2, respectively, and may extend along top surfaces of the first and second gate electrodes G1 and G2, respectively. The steps of patterning the gate dielectric pattern 114, the gate pattern 130, and the gate capping pattern 124 may be performed in a manner of sequentially etching the gate capping pattern 124, the gate pattern 130, and the gate dielectric pattern 114 formed on the substrate 100.

Referring back to FIGS. 18 to 21, the gate spacer GSP may be formed to cover side surfaces of the first and second gate electrodes G1 and G2. The gate spacer GSP may be formed to fill a space between the first and second gate electrodes G1 and G2. A portion of the top surface of the active region ACT located between the first and second gate electrodes G1 and G2 may be covered with the gate spacer GSP.

The source/drain regions SD may be formed in the active region ACT at both sides of the first gate electrode G1. The source/drain regions SD may extend in the first direction D1 and may be formed in the active region ACT at both sides of the second gate electrode G2. The formation of the source/drain regions SD may include performing an ion implantation process on the substrate 100. The source/drain regions SD may have a conductivity type that is different from those of the substrate 100 and the second gate electrode G2 but is the same as that of the first gate electrode G1.

According to some embodiments, channel formation at a boundary region between an active region and a device isolation layer may be suppressed or prevented. In other words, a current flow passing through the boundary region between the active region and the device isolation layer may be suppressed or prevented, consequently to suppress or prevent a hot-electron-induced punchthrough (HEIP) phenomenon, which results in a transistor having a reduced effective channel length, at the boundary region between the active region and the device isolation layer. Thus, by suppressing or preventing HEIP, electric and/or operational characteristics (e.g., reliability) of the semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a device isolation layer on a substrate to define an active region;

a first gate electrode on the active region extending in a first direction parallel to a top surface of the substrate;

a second gate electrode on the device isolation layer and spaced apart from the first gate electrode in the first direction;

a gate spacer between the first gate electrode and the second gate electrode; and source/drain regions in the active region at opposite sides of the first gate electrode, wherein the source/drain regions are spaced apart from each other in a second direction that is parallel to the top surface of the substrate and crossing the first direction, and wherein, when viewed in a plan view, an entirety of the first gate electrode is spaced apart from a boundary between the active region and the device isolation layer.

2. The device as claimed in claim 1, wherein:

the gate spacer covers a side surface of the first gate electrode and extends into a space between the first gate electrode and the second gate electrode to cover a side surface of the second gate electrode, and the side surface of the first gate electrode faces the side surface of the second gate electrode in the first direction.

3. The device as claimed in claim 1, wherein the first and second gate electrodes are completely separated from each other, and the gate spacer covers facing side surfaces of the first and second gate electrodes and crosses the boundary between the active region and the device isolation layer.

4. The device as claimed in claim 3, wherein the second gate electrode is a dummy gate electrode.

5. The device as claimed in claim 1, wherein the second gate electrode extends from a top surface of the device isolation layer onto a top surface of the active region to cross the boundary between the active region and the device isolation layer.

6. The device as claimed in claim 5, wherein the second gate electrode has a same conductivity type as that of the first gate electrode.

7. The device as claimed in claim 6, wherein the source/drain regions are extended into the active region at opposite sides of the second gate electrode and have a same conductivity type as that of the first and second gate electrodes.

8. The device as claimed in claim 5, wherein the second gate electrode has a conductivity type different from that of the first gate electrode.

9. The device as claimed in claim 8, wherein the source/drain regions extend into the active region at opposite sides of the second gate electrode and have a same conductivity type as that of the first gate electrode.

10. The device as claimed in claim 9, wherein the substrate has a same conductivity type as that of the second gate electrode.

11. The device as claimed in claim 10, wherein a conductivity type of the first gate electrode is a p-type, and a conductivity type of the second gate electrode is an n-type.

12. The device as claimed in claim 11, wherein the first gate electrode and the second gate electrode are gate electrodes of first and second PMOS transistors, respectively, and an absolute value of a threshold voltage of the second PMOS transistor is greater than that of the first PMOS transistor.

13. The device as claimed in claim 10, wherein a conductivity type of the first gate electrode is an n-type, and a conductivity type of the second gate electrode is a p-type.

14. The device as claimed in claim 13, wherein:

the first gate electrode and the second gate electrode are first and second NMOS transistors, respectively, and a threshold voltage of the second NMOS transistor is higher than that of the first NMOS transistor.

15. The device as claimed in claim 1, wherein the gate spacer covers side surfaces of the first and second gate electrodes, and fills a space between the first and second gate electrodes.

16. A semiconductor device, comprising:

a device isolation layer on a substrate to define an active region;

a first gate electrode on the active region extending in a first direction parallel to a top surface of the substrate, the first gate electrode having first side surfaces opposite to each other in the first direction and second side surfaces opposite to each other in a second direction that is parallel to the top surface of the substrate and crossing the first direction, the first and second side surfaces of the first gate electrode being on the active region and spaced apart from a boundary between the active region and the device isolation layer;

a second gate electrode on the device isolation layer and spaced apart from the first gate electrode in the first direction;

a gate spacer between the first gate electrode and the second gate electrode, the gate spacer extending from a space between the first gate electrode and the second gate electrode onto the second side surfaces of the first gate electrode; and source/drain regions in the active region at opposite sides of the first gate electrode.

17. The device as claimed in claim 16, wherein at least a portion of the gate spacer covers the boundary between the active region and the device isolation layer and the first side surfaces of the first gate electrodes.

18. The device as claimed in claim 16, wherein the first and second gate electrodes are completely separated from each other and spaced apart from each other along the first direction.

19. The device as claimed in claim 16, wherein the entire first gate electrode has a non-overlapping relationship with the boundary between the active region and the device isolation layer.

20. The device as claimed in claim 16, wherein a periphery of the active region surrounds outermost surfaces of the first gate electrode, as viewed in a plan view, at least a portion of the gate spacer being on the periphery of the active region.

* * * * *